US010982331B2

(12) United States Patent
Lee et al.

(10) Patent No.: US 10,982,331 B2
(45) Date of Patent: Apr. 20, 2021

(54) METHOD FOR FORMING CERAMIC COATING HAVING IMPROVED PLASMA RESISTANCE AND CERAMIC COATING FORMED THEREBY

(71) Applicant: IONES CO., LTD., Gyeonggi-do (KR)

(72) Inventors: Mun Ki Lee, Gyeonggi-do (KR);
Byung Ki Kim, Gyeonggi-do (KR);
Jae Hyuk Park, Gyeonggi-do (KR);
Dae Gean Kim, Gyeonggi-do (KR);
Myoung No Lee, Gyeonggi-do (KR)

(73) Assignee: IONES CO., LTD., Gyeonggi-do (KR)

( * ) Notice: Subject to any disclaimer, the term of this patent is extended or adjusted under 35 U.S.C. 154(b) by 481 days.

(21) Appl. No.: 15/112,086

(22) PCT Filed: Dec. 4, 2014

(86) PCT No.: PCT/KR2014/011796
§ 371 (c)(1),
(2) Date: Sep. 1, 2016

(87) PCT Pub. No.: WO2015/108277
PCT Pub. Date: Jul. 23, 2015

(65) Prior Publication Data
US 2016/0362795 A1    Dec. 15, 2016

(30) Foreign Application Priority Data

Jan. 17, 2014  (KR) .......... 10-2014-0006146
Jan. 17, 2014  (KR) .......... 10-2014-0006147
Jan. 17, 2014  (KR) .......... 10-2014-0006148
Jan. 17, 2014  (KR) .......... 10-2014-0006149

(51) Int. Cl.
| C23C 24/04 | (2006.01) |
| C23C 16/06 | (2006.01) |
| C04B 35/447 | (2006.01) |
| C04B 35/505 | (2006.01) |
| C04B 35/622 | (2006.01) |
| C23C 16/44 | (2006.01) |
| C23C 16/458 | (2006.01) |
| H01J 37/32 | (2006.01) |

(52) U.S. Cl.
CPC ............ *C23C 24/04* (2013.01); *C04B 35/447* (2013.01); *C04B 35/505* (2013.01); *C04B 35/62222* (2013.01); *C23C 16/06* (2013.01); *C23C 16/4404* (2013.01); *C23C 16/4581* (2013.01); *H01J 37/32495* (2013.01); *C04B 2235/5436* (2013.01)

(58) Field of Classification Search
USPC ........................................................ 501/105
See application file for complete search history.

(56) References Cited

U.S. PATENT DOCUMENTS

| 5,686,366 A | * | 11/1997 | Koyama | ............... C04B 35/117 |
| | | | | 501/105 |
| 2003/0121545 A1 | * | 7/2003 | Schwirtlich | ......... C23C 18/1283 |
| | | | | 136/256 |
| 2008/0108225 A1 | | 5/2008 | Sun et al. | |

FOREIGN PATENT DOCUMENTS

| CN | 102912279 | 2/2013 |
| JP | 2003-208901 | 7/2003 |
| JP | 2008-106363 | 5/2008 |
| JP | 2011-208166 | 10/2011 |
| JP | 2012-243629 | * 12/2012 |
| KR | 10-2009-0112657 | 10/2009 |
| KR | 10-2009-0123620 | 12/2009 |
| KR | 10-1075993 | 10/2011 |
| KR | 10-1122494 | 2/2012 |
| KR | 10-2012-0100697 | 9/2012 |

OTHER PUBLICATIONS

Office Action dated Jul. 26, 2016 corresponding to Japanese Application No. 2015-557964, 4 pages.
International Search Report dated Mar. 6, 2015 for PCT/KR2014/011796.
Office Action dated Feb. 2, 2018 corresponding to Chinese Application No. 201480075571.X, 8 pages.

* cited by examiner

*Primary Examiner* — Monique R Peets

(57) ABSTRACT

The present invention relates to a method for forming a ceramic coating having improved plasma resistance and a ceramic coating formed thereby. The present invention discloses the method for forming the ceramic coating having improved plasma resistance and the ceramic coating formed thereby, comprising the steps of: receiving, from a powder supply portion, a plurality of ceramic powders having a first powder particle size range, and transporting the powders using a transport gas; and forming a ceramic coating in which a plurality of first ceramic particles within a first coating particle size range and a plurality of second ceramic particles within a second coating particle size range, which is larger than the first coating particle size range, by causing the transported ceramic powders to collide with a substrate inside a process chamber, at the speed of 100 to 500 m/s so as to be pulverized.

6 Claims, 6 Drawing Sheets

METHOD FOR FORMING CERAMIC COATING HAVING IMPROVED PLASMA RESISTANCE AND CERAMIC COATING FORMED THEREBY

This application claims the priority of Korean Patent Application Nos. 10-2014-0006146, 10-2014-0006147, 10-2014-0006148, and 10-2014-0006149, filed on Jan. 17, 2014 in the KIPO (Korean Intellectual Property Office), the disclosure of which is incorporated herein entirely by reference. Further, this application is the National Stage application of International Application No. PCT/KR2014/011796, filed Dec. 4, 2014, which designates the United States and was published in Korean. Each of these applications is hereby incorporated by reference in their entirety into the present application.

TECHNICAL FIELD

The present invention relates to a forming method of a ceramic coating layer having increased plasma resistance and a ceramic coating layer thereof.

BACKGROUND ART

In order to achieve a very high etch rate and an elaborate line width, a Cl- or F-based gas, which is highly corrosive, is used in semiconductor and/or display manufacturing processes. For the purposes of exploiting operating advantages of processing equipment used in the harsh environment and extending the cycle life of the processing equipment, an Yttrium-based ceramic oxide having excellent plasma resistance is deposited on a surface of a metal product.

The yttrium-based ceramic oxide reacts with the corrosive gas to form an insoluble yttrium fluoride (YF) layer on a surface of the ceramic coating layer, and etching of the yttrium-based ceramic oxide from the corrosive gas is suppressed due to a high adhesion strength of the YF layer formed on the entire surface of the ceramic coating layer.

DISCLOSURE OF THE INVENTION

Technical Problem

Embodiments of the present invention provide a forming method of a ceramic coating layer having increased plasma resistance and a ceramic coating layer thereof.

Embodiments of the present invention also provide a forming method of a ceramic coating layer having increased plasma resistance and a ceramic coating layer thereof, in which the porosity is relatively small (or the compactness is relatively high), surface micro cracks are absent, and ceramic powder control is facilitated.

Embodiments of the present invention also provide a forming method of a ceramic coating layer having increased plasma resistance and a ceramic coating layer thereof, in which hardness, adhesion strength and withstand voltage characteristics are improved.

Technical Solution

According to an aspect of the present invention, there is provided a forming method of a ceramic coating layer having increased plasma resistance, the forming method including receiving ceramic powder including multiple ceramic powder grains having a ceramic powder grain size scale from a powder supply unit and transporting the ceramic powder using a transporting gas, and allowing the transported ceramic powder to collide with a base material provided in a processing chamber at a speed of 100 to 500 m/s to then be pulverized and forming a ceramic coating layer having multiple first and second ceramic particles mixed therein, the multiple first ceramic particles having a first coating grain size and the second ceramic particles having a second coating grain size, wherein the first coating grain size of the first ceramic particles ranges from 200 nm to 900 nm, and the second coating grain size of the second ceramic particles ranges from 900 nm to 10 μm.

The first powder grain size of the ceramic powder ranges from 0.1 μm to 50 μm. The maximum number of the first ceramic particles may exist between 250 nm and 350 nm in the first coating grain size scale and the maximum number of the second ceramic particles may exist between 1.0 μm and 1.2 μm in the second coating grain size scale. The maximum number of the first ceramic particles may be greater than the maximum number of the second ceramic particles. The porosity of the ceramic coating layer may be in the range of 0.01% to 1.0%. The cross-sectional ratio of the first ceramic particles to the second ceramic particles may be in the range of 9:1 to 5:5. In the forming of the ceramic coating layer, the transport gas or the base material may be maintained at a temperature in the range of 0° C. to 1000° C. The ceramic powder may be a brittle material. The ceramic powder may be one element or a mixture of two elements selected from the group consisting of yttrium-based oxide, aluminum nitride, silicon nitride, titanium nitride, $Y_2O_3$—$Al_2O_3$-based compound, $B_4C$, $ZrO_2$, and $Al_2O_3$.

According to another aspect of the present invention, there is provided a ceramic coating layer having improved plasma resistance, which is formed using ceramic powder having a powder grain size ranging from 0.1 μm to 50 μm, the ceramic coating layer comprising: multiple first ceramic particles having a first grain size, and multiple second ceramic particles having a second grain size larger than the first grain size, wherein the multiple first and second ceramic particles are mixed to then be coated on a base material to form a ceramic coating layer, the first grain size of the first ceramic particles ranges from 200 nm to 900 nm, and the second grain size of the second ceramic particles ranges from 900 nm to 10 μm.

The maximum number of the first ceramic particles may exist between 250 nm and 350 nm in the first grain size scale and the maximum number of the second ceramic particles may exist between 1.0 μm and 1.2 μm in the second grain size scale. The maximum number of the first ceramic particles may be greater than the maximum number of the second ceramic particles. The porosity of the ceramic coating layer may be in the range of 0.01% to 1.0%. The cross-sectional ratio of the first ceramic particles to the second ceramic particles may be in the range of 9:1 to 5:5. The ceramic powder may be a brittle material. The first and second ceramic particles may include one element or a mixture of two elements selected from the group consisting of yttrium-based oxide, aluminum nitride, silicon nitride, titanium nitride, $Y_2O_3$—$Al_2O_3$-based compound, $B_4C$, $ZrO_2$, and $Al_2O_3$.

The base material may be a component exposed to a plasma environment. The component may be an internal component of a processing chamber for manufacturing a semiconductor or a display. The component may include one selected from the group consisting of an electro static chuck, a heater, a chamber liner, a shower head, a boat for chemical vapor deposition (CVD), a focus ring, a wall liner, a shield, a cold pad, a source head, an outer liner, a deposition shield, an upper liner, an exhaust plate, an edge ring, a mask frame and equivalents thereof.

According to still another aspect of the present invention, there is provided a ceramic coating layer having a multi coating grain size, which is formed using ceramic powder having a powder grain size ranging from 0.1 μm and 50 μm, the ceramic coating layer including multiple first ceramic particles having a first grain size, and multiple second ceramic particles having a second grain size larger than the first grain size, wherein the multiple first and second ceramic particles are mixed to then be coated on a base material to form a ceramic coating layer, the first grain size of the first ceramic particles ranges from 200 nm to 900 nm, and the second grain size of the second ceramic particles ranges from 900 nm to 10 μm.

Advantageous Effects

As described above, in the method for forming a ceramic coating layer and the ceramic coating layer thereof according to an embodiment of the present invention, the plasma resistance is improved.

In addition, in the method for forming a ceramic coating layer and the ceramic coating layer thereof according to an embodiment of the present invention, the porosity is relatively low (or compactness is relatively high), surface micro cracks are absent, and ceramic powder control is facilitated.

In addition, in the method for forming a ceramic coating layer having increased plasma resistance according to an embodiment of the present invention, and the ceramic coating layer thereof, the hardness, adhesion strength and withstand voltage characteristics are improved.

BRIEF DESCRIPTION OF THE DRAWINGS

FIG. 9A is an SEM photograph illustrating a prior art ceramic coating layer and FIG. 9B is an SEM photograph illustrating a ceramic coating layer according to an embodiment of the present invention.

MODE FOR CARRYING OUT THE INVENTION

Figure 1:
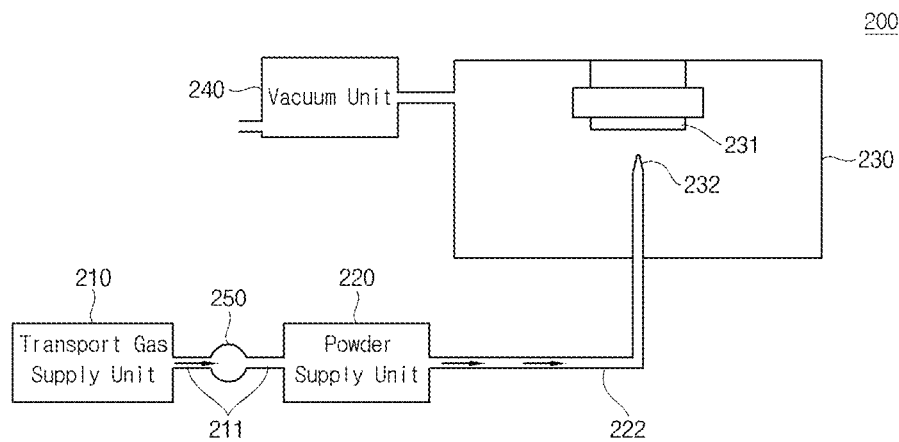
FIG. 1 is a schematic diagram illustrating an apparatus for forming a ceramic coating layer having increased plasma resistance according to an embodiment of the present invention.

Hereinafter, examples of embodiments of the invention will be described in detail with reference to the accompanying drawings such that they can easily be made and used by those skilled in the art.

The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims.

The terminology used herein is for the purpose of describing particular embodiments only and is not intended to be limiting of the invention. As used herein, the singular forms are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In the drawings, the thickness of layers and regions are exaggerated for clarity. As used herein, the term "and/or" includes any and all combinations of one or more of the associated listed items.

It will be understood that, although the terms first, second, etc. may be used herein to describe various members, elements, regions, layers and/or sections, these members, elements, regions, layers and/or sections should not be limited by these terms. These terms are only used to distinguish one member, element, region, layer, and/or section from another. Thus, for example, a first member, a first element, a first region, a first layer and/or a first section discussed below could be termed a second member, a second element, a second region, a second layer and/or a second section without departing from the teachings.

In addition, throughout the specification of the present invention, it is noted that the term "powder" is used in case where a ceramic coating layer is yet to be formed and the term "grain" is used in case where a ceramic coating layer is formed. In addition, the term "mode or modal value" as one of statistics representing central tendency of data means a value of most frequently occurring data.

Figure 2:
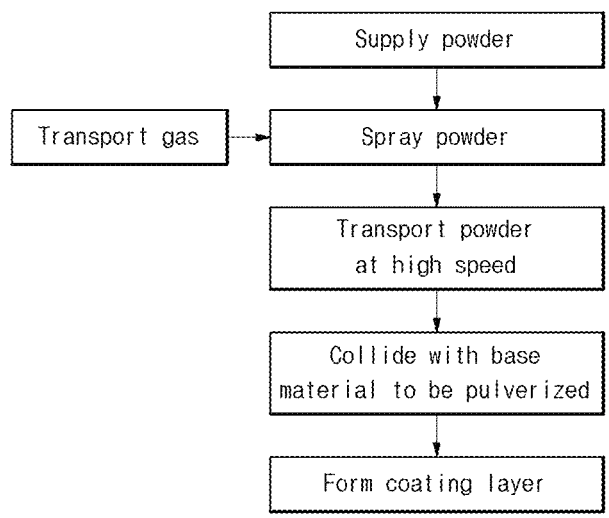
FIG. 2 is a flow chart illustrating a forming method of a ceramic coating layer having increased plasma resistance according to an embodiment of the present invention.

FIG. 1 is a schematic diagram illustrating an apparatus for forming a ceramic coating layer having increased plasma resistance according to an embodiment of the present invention, and FIG. 2 is a flow chart illustrating a forming method of a ceramic coating layer having increased plasma resistance according to an embodiment of the present invention.

As illustrated in FIG. 1, the ceramic coating layer forming apparatus 200 according to the present invention includes a transport gas supply unit 210, a powder supply unit 220 storing and supplying ceramic powder, a transport pipe 222 transporting the ceramic powder from the powder supply unit 220 using a transport gas at a high speed, a nozzle 232 coating/stacking or spraying the ceramic powder from the transport pipe 222 on a base material 231, and a processing chamber 230 allowing the ceramic powder from the nozzle 232 to collide with a surface of the base material 231, to be crushed and/or pulverized to form a ceramic coating layer having a predetermined thickness.

The ceramic coating layer forming method according to the present invention will now be described with reference to FIGS. 1 and 2.

The transport gas stored in the transport gas supply unit 210 may include one element or a mixture of two elements selected from the group consisting of oxygen, helium, nitrogen, argon, carbon dioxide, hydrogen and equivalents thereof, but aspects of the present invention are not limited thereto. The transport gas is directly supplied from the transport gas supply unit 210 to the powder supply unit 220 through a pipe 211, and the flow rate and pressure of the transport gas may be controlled by a flow rate controller 250.

The powder supply unit 220 stores and supplies a large amount of ceramic powder. The ceramic powder may have a grain size in the range of approximately 0.1 μm to approximately 50 μm. As an example, the ceramic powder may have a first grain size scale and a first modal value and may demonstrate a similar characteristic to a normal distribution.

If the ceramic powder grain size scale is smaller than approximately 0.1 μm, it is difficult to store and supply powder. In addition, due to cohesion occurring during storage and supply of ceramic powder, a powder compact in which grains having sizes smaller than 0.1 μm are conglomerated when the ceramic powder is sprayed and the ceramic powder collides with a base material and is crushed and/or pulverized, may be readily formed. Moreover, it is also difficult to form a ceramic coating layer having a relatively large area.

In addition, if the ceramic powder grain size scale is larger than approximately 50 μm, a sand blasting phenomenon is likely to occur when the ceramic powder is sprayed and the ceramic powder collides with a base material and is crushed and/or pulverized. Since even a partly formed ceramic coating layer has a relatively large powder grain size scale, the ceramic coating layer becomes unstable and the porosity of the interior or surface of the ceramic coating layer may increase, material characteristics may not be properly realized.

If the ceramic powder grain size scale is between approximately 0.1 μm and approximately 50 μm, it is possible to obtain a ceramic coating layer having increased plasma resistance, in which the porosity is relatively low (or the compactness is relatively large), surface micro cracks are absent, and ceramic powder control is facilitated. In addition, if the ceramic powder grain size scale is between approximately 0.1 μm and approximately 50 μm, it is possible to obtain a ceramic coating layer having increased plasma resistance, in which the laminating speed of the ceramic coating layer is relatively high, semi-transparency is provided, and material characteristics can be easily realized.

The ceramic powder may be a brittle material. The brittle material is easily cracked and rarely elastic.

The ceramic powder may include one element or a mixture of two elements selected from the group consisting of yttrium based oxide, fluoride, nitride, $Y_2O_3$—$Al_2O_3$ based compound (e.g., YAG, YAP or YAM), $B_4C$, $ZrO_2$, alumina ($Al_2O_3$) and equivalents thereof, but aspects of the present invention are not limited thereto.

In detail, the ceramic powder as a brittle material may include one element or a mixture of two elements selected from the group consisting of yttria ($Y_2O_3$), YAG ($Y_3Al_5O_{12}$), rare earth metal based (elements of element Nos. 57 to 71, including Y and Sc) oxide, alumina ($Al_2O_3$), bio glass, silicon dioxide ($SiO_2$), hydroxyapatite ($Ca_{10}(PO_4)_6(OH)_2$), titanium dioxide ($TiO_2$) and equivalents thereof, but aspects of the present invention are not limited thereto.

In more detail, the ceramic powder as a brittle material may include one element or a mixture of two elements selected from the group consisting of hydroxyapatite ($Ca_{10}(PO_4)_6(OH)_2$), calcium phosphate, bio glass, $Pb(Zr,Ti)O_3$ (PZT), alumina ($Al_2O_3$), titanium dioxide ($TiO_2$), zirconia ($ZrO_2$), yttria ($Y_2O_3$), yttria stabilized zirconia (YSZ), Dysprosia ($Dy_2O_3$), Gadolinia ($Gd_2O_3$), Ceria ($CeO_2$), Gadolinia doped Ceria (GDC), magnesia (MgO), barium titanate ($BaTiO_3$), nickel manganate ($NiMn_2O_4$), potassium sodium niobate ($KNaNbO_3$), bismuth potassium titanate ($BiKTiO_3$), bismuth sodium titanate ($BiNaTiO_3$), $CoFe_2O_4$, $NiFe_2O_4$, $BaFe_2O_4$, $NiZnFe_2O_4$, $ZnFe_2O_4$, $MnxCo_{3-x}O_4$ (where x is a solid number of 3 or less), bismuth ferrite ($BiFeO_3$), bismuth zinc niobate ($Bi_{1.5}Zn_1Nb_{1.5O7}$), lithium phosphate aluminum titanium glass ceramic, Li—La—Zr—O-based Garnet oxide, Li—La—Ti—O-based Perovskite oxide, La—Ni—O-based oxide, lithium iron phosphate, lithium-cobalt oxide, Li—Mn—O-based Spinel oxide (lithium manganese oxide), lithium phosphate aluminum gallium oxide, tungsten oxide, tin oxide, nickel acid lanthanum, lanthanum-strontium-manganese oxide, lanthanum-strontium-iron-cobalt oxide, silicate-based phosphor, SiAlON-based phosphor, aluminum nitride, silicon nitride, titanium nitride, AlON, silicon carbide, titanium carbide, tungsten carbide, magnesium boride, titanium boride, metal oxide-metal nitride mixture, metal oxide-metal carbide mixture, ceramic-polymer mixture, ceramic-metal mixture, nickel, copper, silicon, and equivalents thereof, but aspects of the present invention are not limited thereto.

Figure 3:
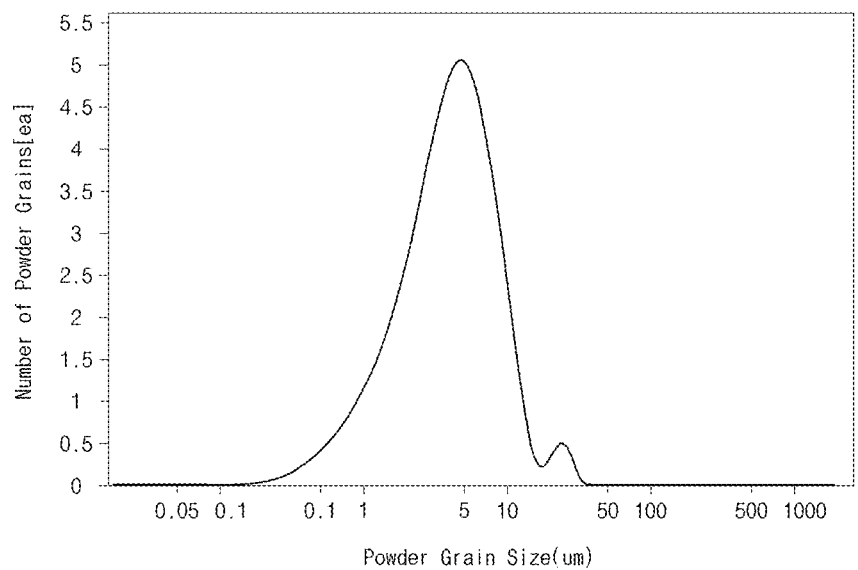
FIG. 3 is a graph illustrating a grain size distribution of ceramic powder according to an embodiment of the present invention.

FIG. 3 is a graph illustrating a grain size distribution of ceramic powder according to an embodiment of the present invention. Grain size characteristics of ceramic powder will now be described in more detail with reference to FIG. 3. In FIG. 3, the X axis indicates ceramic powder grain size (μm), represented on a log scale, and the Y axis indicates the number (ea) of powder grain sizes (nm) or the ratio (%) of powder grain sizes (nm).

The ceramic powder grain size is analyzed by laser diffraction. An example of equipment for measuring a ceramic powder grain size is LS 13 320 manufactured by Beckman Coulter Inc.

In detail, the method of analyzing the ceramic powder grain size will now be described. First, powder is added to a solvent, such as water, to be diluted into a suspension having a concentration of approximately 10% to yield a slurry. Then, the slurry is subjected to a treatment using ultrasonic wave or a rotor to uniformly disperse the ceramic powder. Next, laser beams are applied to the ceramic powder in the dispersed slurry state while circulating the slurry powder. Here, the intensity of the laser beams passing through the ceramic powder and scattered is measured to analyze the ceramic powder grain size. The scope of ceramic powder analysis may vary according to the model of the analyzing equipment used, but is generally in the range of approximately 0.017 μm to approximately 2,000 μm.

As illustrated in FIG. 3, the ceramic powder may have a first grain size scale and a first modal value. In more detail, the first grain size scale of the ceramic powder may range from 0.1 μm to 25 μm and the first modal value of the ceramic powder may be in the range of between approximately 1 μm and approximately 10 μm.

In addition, the ceramic powder may also have a second grain size scale and a second modal value. In more detail, the second grain size scale of the ceramic powder may range from 15 µm to 50 µm and the second modal value of the ceramic powder may be in the range of between approximately 20 µm and approximately 40 µm, preferably in the range of between approximately 30 µm and approximately 35 µm.

As an example, the maximum number of the first modal value of the ceramic powder may be smaller than approximately 5 (or 5%) and the maximum number of the second modal value of the ceramic powder may be smaller than approximately 0.5 (or 0.5%)

Practically, if the first and second grain size scales, the first and second modal values, and the maximum numbers (proportions) of ceramic powder are beyond the numeral values stated above, it is difficult to obtain a ceramic coating layer having a porosity of 0.01% to 1.0%. In addition, if the ceramic powder is beyond the above-stated range, it is difficult to obtain a ceramic coating layer having predetermined levels of hardness, adhesion strength and withstand voltage, which will be described below.

As an example, if a ceramic coating layer is formed using only the ceramic powder having a smaller grain size scale than approximately 0.1 µm, the power itself has a relatively small grain size scale. Thus, the ceramic coating layer has good transmittance and a low porosity. However, the forming speed of the ceramic coating layer is relatively low and the ceramic powder grains are conglomerated, making it difficult to achieve ceramic powder control.

As another example, if a ceramic coating layer is formed using the ceramic powder having a larger grain size scale than approximately 50 µm, the power itself has a relatively large grain size scale. Thus, the laminating speed of the ceramic coating layer is relatively high and the ceramic coating layer has a high porosity, making the ceramic coating layer become unstable due to surface micro cracks.

Practically, if a plasma-resistant yttrium oxide ceramic coating layer applied to a semiconductor process is formed using ceramic powder having a larger grain size scale than approximately 50 µm, in spite of high plasma-resistance of the yttrium oxide, due to an unstable microstructure generated during formation of a ceramic coating layer, pores present among coarse particles in the microstructure are large-sized and the ceramic coating layer has an increased surface area due to the pores. Accordingly, plasma corrosion is accelerated due to corrosive gas induced into spaces among the pores, and corroded yttrium oxide particles are separated from the ceramic coating layer to act as contaminant particles.

Meanwhile, the ceramic powder may be roughly spherical, which is advantageous for high-speed transport, but aspects of the present invention are not limited thereto. The ceramic powder may also have a layered structure, a need-shaped structure or a polygonal structure.

In addition, the ceramic powder having one grain size scale and one modal value and the ceramic powder having two grain size scales and two modal values are exemplified in the above description. However, when necessary, the ceramic powder having three or more grain size scales and three or more modal values may also be employed in the present invention.

Of course, the grain size scale and the modal value of the ceramic powder used in the present invention are not limited to the first and second grain size scales and the first and second modal values. As described above, the ceramic coating layer according to the present invention may have one modal value and may be formed using the ceramic powder having a grain size scale in the range of approximately 0.1 µm to approximately 50 µm. Here, the modal value may be in the range of approximately 1 µm to approximately 10 µm, more preferably in the range of approximately 4 µm to approximately 10 µm.

Here, the ceramic powder according to the present invention may be formed by the method disclosed in Korean Patent No. 10-1075993 (Registered on Oct. 17, 2011), but aspects of the present invention are not limited thereto.

Referring again to FIGS. 1 and 2, the ceramic coating layer forming method according to the present invention will further be described.

The processing chamber 230 is maintained in vacuum during formation of the ceramic coating layer. To this end, a vacuum unit 240 may be connected to the processing chamber 230. In more detail, the processing chamber 230 may be maintained at a pressure in the range of approximately 1 Pa to approximately 800 Pa, and the ceramic powder transported by the high-speed transport pipe 222 may be in the range of approximately 500 Pa to approximately 2000 Pa. However, either way, the pressure of the high-speed transport pipe 222 should be higher than that of the processing chamber 230.

In addition, since the internal temperature of the processing chamber 230 is in the range of approximately 0° C. to approximately 30° C., it is advantageous in that a separate member for increasing or decreasing the internal temperature of the processing chamber 230 is not necessarily provided. That is to say, the transport gas or/and the base material may not be separately heated and may be maintained at a temperature in the range of approximately 0° C. to approximately 30° C.

However, in some case, for the purposes of improving the deposition efficiency and compactness of a ceramic coating layer, the transport gas or/and the base material may be heated at a temperature in the range of approximately 300° C. to approximately 1000° C. That is to say, the transport gas in the transport gas supply unit 210 or the base material 231 in the processing chamber 230 may be heated by a separate heater (not shown). The stress applied to the ceramic powder at the time of forming a ceramic coating layer can be reduced by heating the transport gas or/and the base material 231, thereby obtaining the ceramic coating layer having a small porosity and high compactness. Here, when the temperature of the transport gas or/and base material is higher than approximately 1000° C., the ceramic powder is melted to cause rapid phase transition. Accordingly, the porosity of the ceramic coating layer may be increased and the internal structure of the ceramic coating layer may become unstable. In addition, when the temperature of the transport gas or/and base material is lower than approximately 300° C., the stress applied to the ceramic powder may not be reduced.

However, the present invention does not limit the temperature range to those disclosed herein. According to the characteristic of the base material forming the ceramic coating layer, the internal temperatures of the transport gas and the base material and/or the internal temperature of the processing chamber 230 may be adjusted between 0° C. and 1000° C.

Meanwhile, as described above, a pressure difference between the processing chamber 230 and the high-speed transport pipe 222 (or the transport gas supply unit 210 or the powder supply unit 220) may be approximately 1.5 times to approximately 2000 times. If the pressure difference is smaller than approximately 1.5 times, it may be difficult to transport the ceramic powder at a high speed. If the pressure difference is larger than approximately 2000 times, the surface of the base material may be over-etched due to the presence of the ceramic powder.

The ceramic powder in the powder supply unit 220 is sprayed through the transport pipe 222 to then be transported to the processing chamber 230 at high speed according to the pressure difference between the processing chamber 230 and the transport pipe 222.

In addition, the nozzle 232 connected to the transport pipe 222 is provided in the processing chamber 230, and the ceramic powder is allowed to collide with the base material 231 at a speed of approximately 100 to approximately 500 m/s. That is to say, the ceramic powder passing through the nozzle 232 is crushed and/or pulverized by the kinetic energy obtained during transport of the ceramic powder and the collision energy generated during high-speed collision, thereby forming a ceramic coating layer having a predetermined thickness on the surface of the base material 231.

As will be described below, the ceramic powder is disintegrated into first ceramic particles having a first grain size scale and a first modal value and second ceramic particles having a second grain size scale and a second modal value, and the first and second ceramic particles are irregularly mixed with each other to be laminated on the surface of the base material 231, thereby forming the ceramic coating layer having a small porosity and high compactness.

In other words, the ceramic powder having the first grain size scale and the first modal value and having a normal distribution is allowed to collide with the base material 231 at a speed of approximately 100 to approximately 500 m/s and is crushed and/or pulverized, thereby obtaining the ceramic coating layer having increased plasma resistance, that is, the ceramic coating layer having at least two particle peaks of first ceramic particles having the first grain size scale and the first modal value and second ceramic particles having the second grain size scale and the second modal value. Here, the first grain size scale of first ceramic particles is smaller than the second grain size scale of second ceramic particles and the first modal value of first ceramic particles is smaller than the second modal value of second ceramic particles, thereby providing a ceramic coating layer structured such that sand grains having small grain sizes are positioned between gravel grains having large grain sizes, that is, a ceramic coating layer having an extremely small porosity and a high laminating/coating speed. The structure of the ceramic coating layer will be described below.

Figure 4:
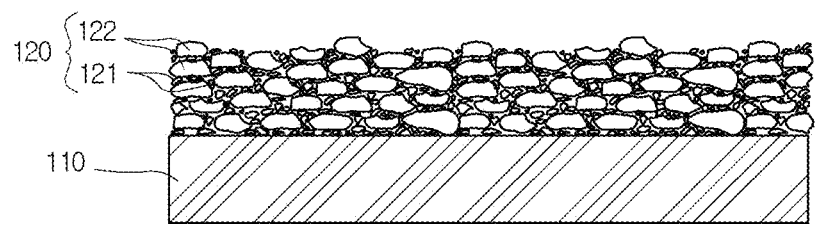
FIG. 4 is a schematic diagram illustrating a cross section of a ceramic coating layer having increased plasma resistance according to an embodiment of the present invention.
Figure 5:
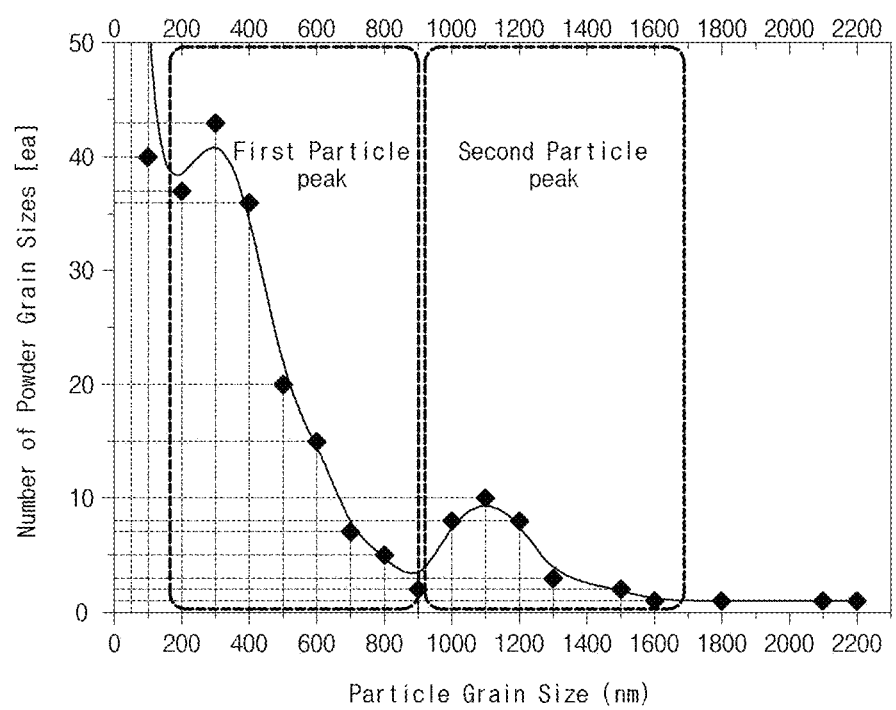
FIG. 5 is a graph illustrating grain size distributions of first and second ceramic particles in a ceramic coating layer according to an embodiment of the present invention.

FIG. 4 is a schematic diagram illustrating a cross section of a ceramic coating layer having increased plasma resistance according to an embodiment of the present invention and FIG. 5 is a graph illustrating grain size distributions of first and second ceramic particles in a ceramic coating layer according to an embodiment of the present invention. In FIG. 5, the X axis indicates the grain size (nm) of a ceramic coating layer and the Y axis indicates the number (ea) or proportion (%) of grain sizes (nm) of the ceramic coating layer. Although the grain sizes of the X axis can be represented up to 10,000 nm in FIG. 5, the graph of FIG. 5 is abbreviated for the sake of convenience.

Here, the grain sizes of first and second ceramic particles forming the ceramic coating layer are analyzed by a scanning electron microscope (SEM), e.g., SNE-4500M equipment. In more detail, the method of analyzing the coating grain size will now be described. First, a specimen having a ceramic coating layer to be analyzed is cut to obtain a cross section and the cross section is grinded. Next, the ceramic coating layer is photographed using the SEM and a photographed image of the ceramic coating layer is processed by image processing software to analyze grain sizes of the first and second ceramic particles. In the present invention, the cross section of the ceramic coating layer having a sectional area of approximately 110 µm2 was photographed to analyze the grain sizes of first and second ceramic particles. In addition, the numbers of first and second grain sizes in the range of approximately 50 nm to approximately 2200 nm were obtained by calculating lengths of longest axes of the first and second ceramic particles. However, second ceramic particles having a grain size of 10 µm or less were observed.

As illustrated in FIGS. 4 and 5, the ceramic coating layer 120 having increased plasma resistance according to the present invention includes a plurality of first ceramic particles 121 and a plurality of second ceramic particles 122 formed on the surface of the base material 110, the first ceramic particles 121 having a first grain size and the second ceramic particles 122 having a second grain size different from the first grain size and disposed between each of the plurality of first ceramic particles 121. That is to say, the ceramic coating layer 120 according to the present invention is configured such that the first ceramic particles 121 having a relatively small grain size compactly filled in crevices, spaces or gaps created in the second ceramic particles 122 having a relatively large grain size.

In more detail, the first ceramic particles 121 have a first grain size scale and a first modal value and the second ceramic particles 122 have a second grain size scale larger than the first grain size scale and a second modal value larger than the first modal value. In addition, the first ceramic particles 121 and the second ceramic particles 122 are mixed with each other and are laminated/coated on the base material, thereby forming the ceramic coating layer 120 having a small porosity and compactness.

In more detail, the first grain size scale of the first ceramic particles 121 ranges from approximately 1 nm to approximately 900 nm, and the first modal value of the first ceramic particles 121 ranges from approximately 250 nm to approximately 800 µm, preferably from approximately 250 nm to approximately 350 nm, but not limited thereto. As an example, the first modal value of the first ceramic particles 121 may be slightly smaller or larger than the grain size scales stated above.

Here, the first ceramic particles 121 demonstrate similar features to a normal distribution in the range of approximately 200 nm to approximately 900 nm with regard to the first modal value of the first ceramic particles 121 (between 250 nm and 800 nm). However, the first ceramic particles 121 having a smaller size than 200 nm predominantly exist. That is to say, as the grain size scale of the first ceramic particles 121 is reduced, the number (proportion) of the first ceramic particles 121 is gradually increased. In the present invention, however, due to limitation of measuring equipment, the number (proportion) of the first ceramic particles 121 smaller than 200 nm or the modal value will be ignored.

However, the first grain size of the first ceramic particles 121 smaller than approximately 1 nm to approximately 200 nm means that the ceramic powder for forming the first ceramic particles 121 also has a smaller grain size than approximately 1 nm to approximately 200 nm. In this case, ceramic powder control is quite difficult to achieve. In addition, the first grain size of the first ceramic particles 121 larger than approximately 900 nm means that the light transmittance of the ceramic coating layer 120 starts to decrease.

In addition, the second grain size scale of the second ceramic particles 122 may be in the range of approximately 900 nm to approximately 10 µm, preferably in the range of approximately 900 nm to approximately 3 µm, and the second modal value of the second ceramic particles 122 may be in the range of approximately 1.0 µm to approximately 5.0 µm, preferably in the range of approximately 1.0 µm to approximately 1.2 µm, but aspects of the present invention are not limited thereto. As an example, the second modal value of the second ceramic particles 122 may be slightly smaller or larger than the numeral values stated above.

However, the second grain size of the second ceramic particles 122 smaller than approximately 900 nm means that the laminating speed of the ceramic coating layer is reduced, and the second grain size of the second ceramic particles 122 larger than approximately 10 µm means that the light transmittance of the ceramic coating layer 120 is lowered, the porosity increases, and the internal structure of the ceramic coating layer 120 becomes unstable.

The second grain size scale of the second ceramic particles 122 is limited to 3 µm above due to limitation of measuring equipment, but aspects of the present invention are not limited thereto.

In addition, the first ceramic particles may also be referred to as first grains and the second ceramic particles may be referred to as second grains, the present invention is not limited to those terms used herein.

Meanwhile, the maximum number of first modal values may be approximately 2 to 10 times larger than that of second modal values, preferably 2 to 5 times.

In more detail, as illustrated in FIG. 5, the maximum number of first modal values in the first ceramic particles is approximately 40 in approximately 300 nm, and the maximum number of second modal values in the second ceramic particles is approximately 10 in approximately 1100 nm. That is to say, the maximum number of first modal values is approximately 4 times larger than that of second modal values, but aspects of the present invention are not limited thereto. In addition, the grain size scale for distinguishing the first ceramic particles from the second ceramic particles is approximately 900 nm, and the number of grain sizes in the grain size scale of approximately 900 nm is approximately 2 or 3. In other words, the number (proportion) of grain sizes in the grain size scale for distinguishing the first ceramic particles from the second ceramic particles is approximately 20 to 30% of the maximum number of second modal values.

In addition, if the proportion (the maximum number of first modal values being approximately 2 to 10 times, preferably approximately 2 to 5 times), is beyond the proportion stated above, for example, if the maximum number of first modal values is larger than the proportion stated above, the light transmittance of the ceramic coating layer may be improved, which is advantageous for realizing material characteristics, while the laminating speed of the ceramic coating layer is lowered. As another example, if the first modal values is smaller than the proportion stated above, the laminating speed of the ceramic coating layer is increased, the porosity becomes large, so that surface micro cracks become increased, making the ceramic coating layer unstable.

The porosity of the ceramic coating layer 120 formed by the forming method of the ceramic coating layer 120 may be in the range of approximately 0.01% to approximately 1.0%, preferably in the range of approximately 0.01% to approximately 0.2%. That is to say, the porosity is determined by the first grain size scale and first modal value of the first ceramic particles 121, the second grain size scale and second modal value of the second ceramic particles 122, and the numbers (proportions) of the first and second modal values of the first and second ceramic particles 121 and 122. If the numeral values are beyond the range stated above, the laminating speed of the ceramic coating layer 120 may be excessively reduced or the porosity may become excessively increased. That is to say, when the ceramic coating layer 120 formed by the forming method of the ceramic coating layer 120 has a porosity of approximately 0.01% to approximately 1.0%, the surface micro cracks become small, thereby stabilizing the microstructure of the ceramic coating layer 120.

Here, the porosity of the ceramic coating layer 120 is measured by the image processing software, which is well known to one skilled in the art, and will not be described in detail.

In addition, the thickness of the ceramic coating layer 120 may be in the range of approximately 1 µm to approximately 100 µm. If the thickness of the ceramic coating layer 120 is smaller than approximately 1 µm, it is difficult for the base material 110 to be industrially used. In addition, if the thickness of the ceramic coating layer 120 is larger than approximately 100 µm, the light transmittance may be markedly reduced.

In addition, the light transmittance of the ceramic coating layer 120 may be adjusted to be in the range of approximately 1% to approximately 99%, and the light transmittance of the ceramic coating layer 120 may be controlled by the overall thickness of the ceramic coating layer 120, the first and second grain size scales and the first and second modal values of the first and second ceramic particles 121 and 122. As an example, assuming that the ceramic coating layer 120 has a uniform thickness and the maximum number of second modal values is fixed, the light transmittance may become larger according as the maximum number of first modal values of the first ceramic particles 121 among the first and second ceramic particles 121 and 122 is increased, and may become smaller according as the maximum number of first modal values of the first ceramic particles 121 is decreased. In addition, assuming that the maximum number of second modal values is fixed, the porosity may become smaller according as the maximum number of first modal values of the first ceramic particles 121 is increased and may become larger according as the maximum number of first modal values of the first ceramic particles 121 is decreased, regardless of the thickness of the ceramic coating layer 120.

Meanwhile, the cross-sectional ratio of the first ceramic particles 121 to the second ceramic particles 122 is in the range of 9:1 to 5:5, preferably in the range of 7.7:2.3. As described above, the cross-sectional area to be analyzed may be 110 µm2. When the cross-sectional ratio of the first ceramic particles 121 to the second ceramic particles 122 is within the range stated above, the porosity may be relatively low, surface micro cracks are absent, the ceramic coating layer 120 is semitransparent and material characteristics can be easily realized. As an example, when the cross-sectional ratio of the first ceramic particles 121 to the second ceramic particles 122 is beyond the range stated above, that is, when the proportion of the first ceramic particles 121 is relatively large, the time taken to form/laminate the ceramic coating layer 120 may be extended, and when the proportion of the first ceramic particles 121 is relatively small, the porosity may increase. However, when the cross-sectional ratio of the first ceramic particles 121 to the second ceramic particles 122 is beyond the range stated above, that is, when the proportion of the second ceramic particles 122 is relatively large, the time taken to form/laminate the ceramic coating layer 120 may be shortened while increasing the porosity, and when the proportion of the second ceramic particles 122 is relatively small, the time taken to form/laminate the ceramic coating layer 120 may be extended.

Meanwhile, the first ceramic particles 121 or the second ceramic particles 122 may be a brittle material, as described above. The first ceramic particles 121 or the second ceramic particles 122, which are brittle materials, may include one element or a mixture of two elements selected from the group consisting of yttrium based oxide, fluoride, nitride, $Y_2O_3$—$Al_2O_3$ based compound (e.g., YAG, YAP or YAM), $B_4C$, $ZrO_2$, alumina ($Al_2O_3$) and equivalents thereof, but aspects of the present invention are not limited thereto.

In detail, the first ceramic particles 121 or the second ceramic particles 122, which are brittle materials, may include one element or a mixture of two elements selected from the group consisting of yttria ($Y_2O_3$), YAG ($Y_3Al_5O_{12}$), rare earth metal based (elements of element Nos. 57 to 71, including Y and Sc) oxide, alumina ($Al_2O_3$), and equivalents thereof, but aspects of the present invention are not limited thereto.

In more detail, the first ceramic particles 121 or the second ceramic particles 122, which are brittle materials, may include one element or a mixture of two elements selected from the group consisting of yttria ($Y_2O_3$), YAG ($Y_3Al_5O_{12}$), rare earth metal based (elements of element Nos. 57 to 71, including Y and Sc) oxide, alumina ($Al_2O_3$), bio glass, silicon dioxide ($SiO_2$), hydroxyapatite ($Ca_{10}(PO_4)_6(OH)_2$), titanium dioxide ($TiO_2$) and equivalents thereof, but aspects of the present invention are not limited thereto. In more detail, the first ceramic particles 121 or the second ceramic particles 122 as a brittle material may include one element or a mixture of two elements selected from the group consisting of hydroxyapatite ($Ca_{10}(PO_4)_6(OH)_2$), calcium phosphate, bio glass, $Pb(Zr,Ti)O_3$(PZT), alumina ($Al_2O_3$), titanium dioxide ($TiO_2$), zirconia ($ZrO_2$), yttria ($Y_2O_3$), yttria stabilized zirconia (YSZ), Dysprosia ($Dy_2O_3$), Gadolinia ($Gd_2O_3$), Ceria ($CeO_2$), Gadolinia doped Ceria (GDC), magnesia (MgO), barium titanate ($BaTiO_3$), nickel manganate ($NiMn_2O_4$), potassium sodium niobate ($KNaNbO_3$), bismuth potassium titanate ($BiKTiO_3$), bismuth sodium titanate ($BiNaTiO_3$), $CoFe_2O_4$, $NiFe_2O_4$, $BaFe_2O_4$, $NiZnFe_2O_4$, $ZnFe_2O_4$, $MnxCo_{3-x}O_4$ (where x is a solid number of 3 or less), bismuth ferrite ($BiFeO_3$), bismuth zinc niobate ($Bi_{1.5}Zn_1Nb_{1.5O7}$), lithium phosphate aluminum titanium glass ceramic, Li—La—Zr—O-based Garnet oxide, Li—La—Ti—O-based Perovskite oxide, La—Ni—O-based oxide, lithium iron phosphate, lithium-cobalt oxide, Li—Mn—O-based Spinel oxide (lithium manganese oxide), lithium phosphate aluminum gallium oxide, tungsten oxide, tin oxide, nickel acid lanthanum, lanthanum-strontium-manganese oxide, lanthanum-strontium-iron-cobalt oxide, silicate-based phosphor, SiAlON-based phosphor, aluminum nitride, silicon nitride, titanium nitride, AlON, silicon carbide, titanium carbide, tungsten carbide, magnesium boride, titanium boride, metal oxide-metal nitride mixture, metal oxide-metal carbide mixture, ceramic-polymer mixture, ceramic-metal mixture, nickel, copper, silicon, and equivalents thereof, but aspects of the present invention are not limited thereto.

Here, the base material 110 may include one selected from the group consisting of glass, a metal, a plastic material, a polymer resin, ceramic and equivalents thereof, but aspects of the present invention are not limited thereto.

Figure 6A:
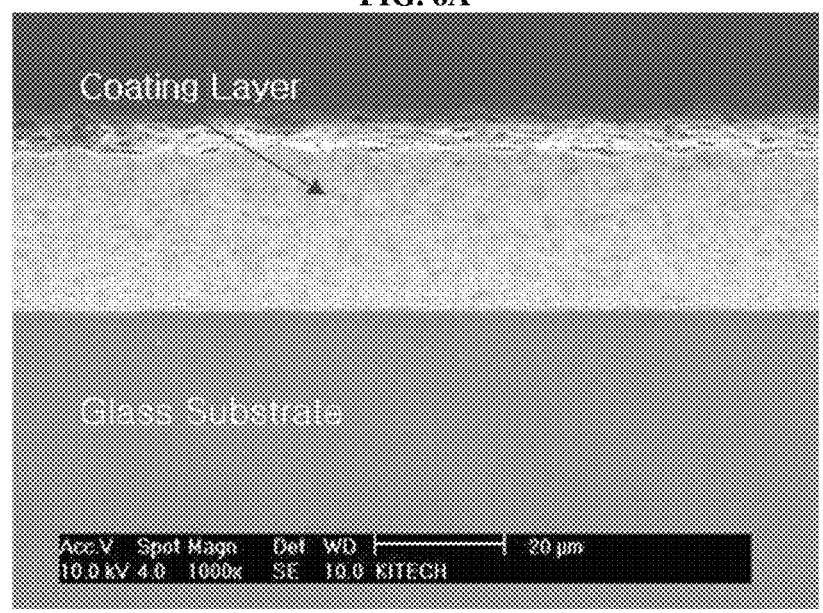
FIGS. 6A to 6C are SEM photographs of a plasma-resistant $Y_2O_3$ ceramic coating layer having increased plasma resistance according to an embodiment of the present invention.
Figure 6B:
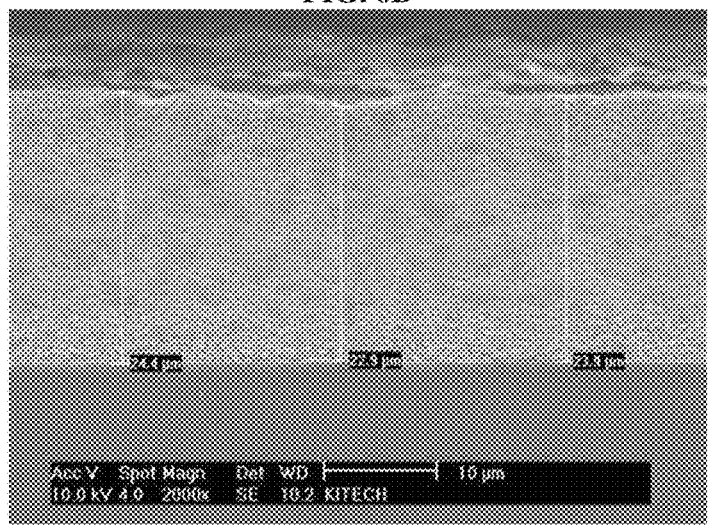
Figure 6C:
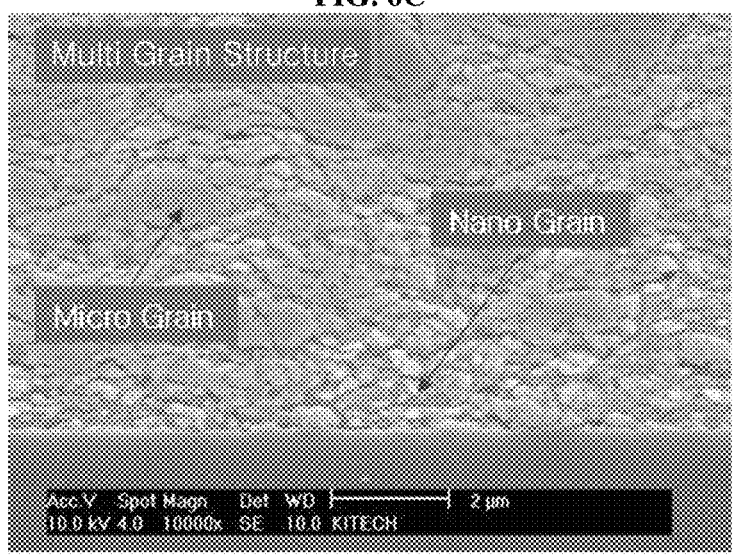
Figure 7A:
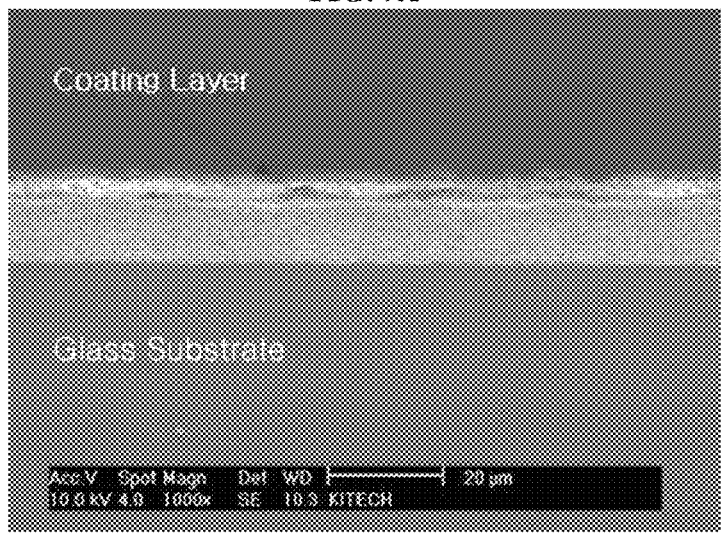
FIGS. 7A to 7C are SEM photographs of an $Al_2O_3$ ceramic coating layer having increased plasma resistance according to an embodiment of the present invention.
Figure 7B:
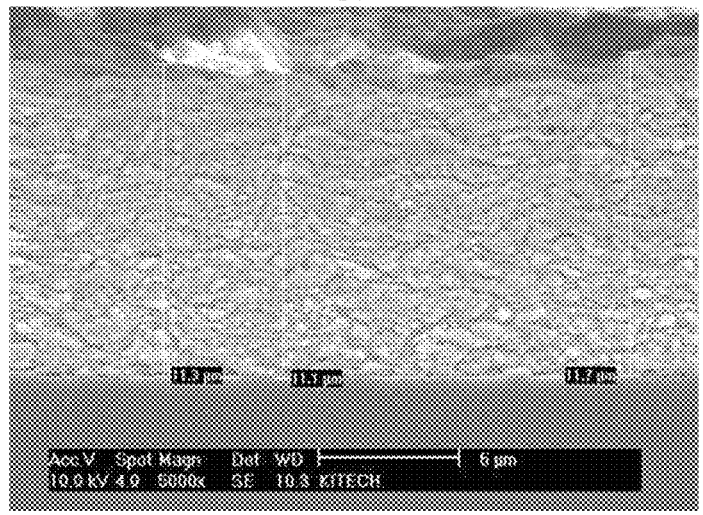
Figure 7C:
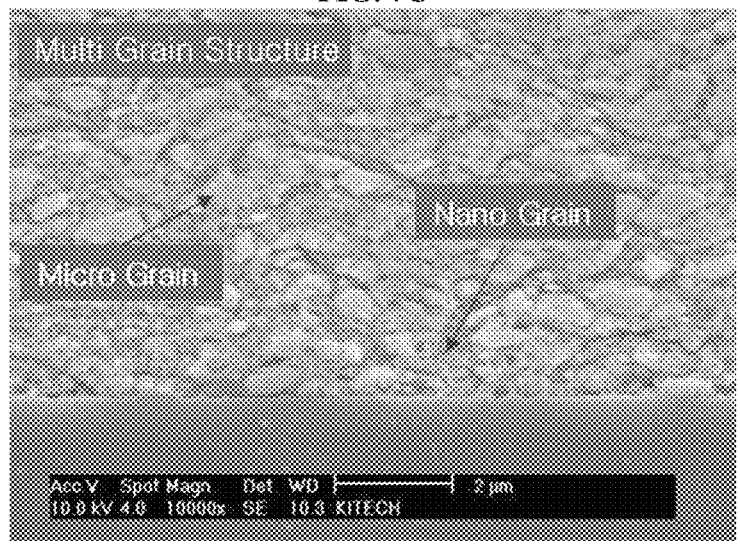
Figure 8A:
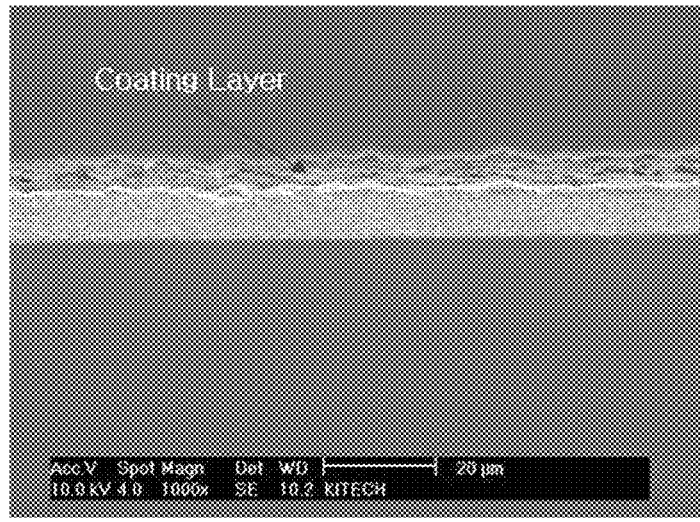
FIGS. 8A to 8C are SEM photographs
Figure 8B:
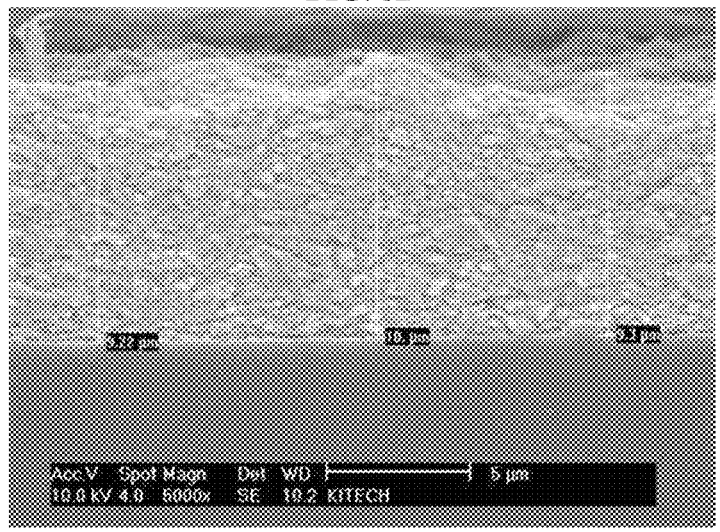
Figure 8C:
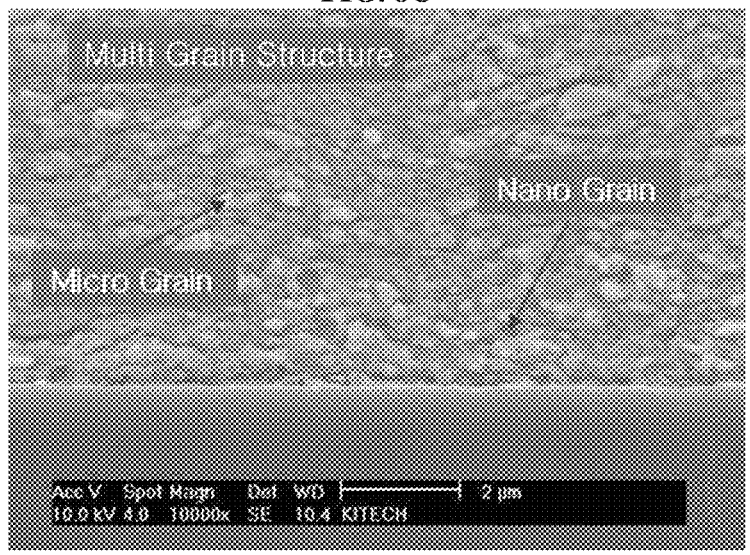

FIGS. 6A to 6C are SEM photographs of a plasma resistant $Y_2O_3$ ceramic coating layer having increased plasma resistance according to an embodiment of the present invention, FIGS. 7A to 7C are SEM photographs of an $Al_2O_3$ ceramic coating layer having increased plasma resistance according to an embodiment of the present invention, and FIGS. 8A to 8C are SEM photographs of a hydroxyapatite [$Ca_{10}(PO_4)_6(OH)_2$] ceramic coating layer having increased plasma resistance according to an embodiment of the present invention.

In photographs shown in FIGS. 6A to 8C, portions indicated by "nano grain" mean the first ceramic particles hereto described and portions indicated by "micro grain" mean the second ceramic particles hereto described.

As confirmed from many photographs shown in the figures of FIGS. 6A to 8C, the first and second ceramic particles forming the ceramic coating layer according to the present invention may be configured by horizontally (left-to-right) elongated layers or laterally lying needles formed on a glass substrate, rather than circles or spheres. With this configuration, the porosity of the ceramic coating layer according to the present invention is markedly reduced and surface micro cracks are reduced, thereby providing a stable microstructure. Therefore, in a semiconductor manufacturing process of a product employing the ceramic coating layer according to the present invention, for example, improved plasma resistance can be demonstrated, and a corrosion speed is retarded, thereby lowering the proportion of particles scattered in a semiconductor processing chamber.

In addition, while it has been described that the second ceramic particles have a second grain size of approximately 3 µm, which is due to limitation of analyzing equipment, one skilled in the art should appreciate that the second grain size of the second ceramic particles may be 10 µm or less.

Figure 9A:
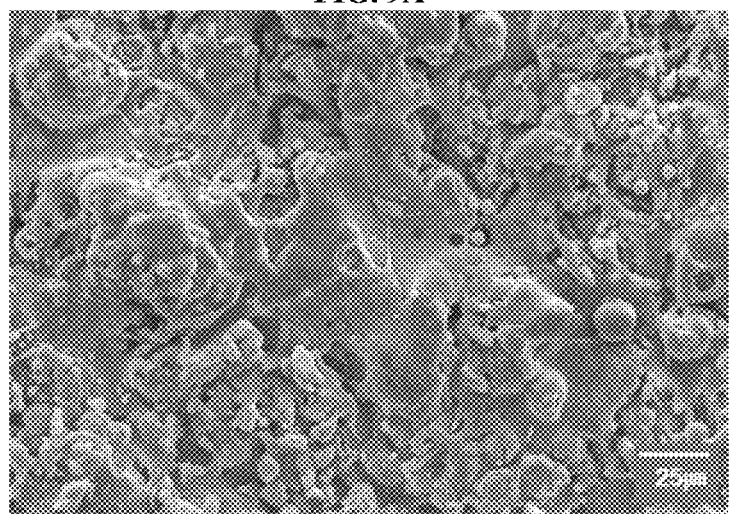
FIG. 9A is an SEM photograph of a hydroxyapatite $[Ca_{10}(PO_4)_6(OH)_2]$ ceramic coating layer having increased plasma resistance according to an embodiment of the present invention.
Figure 9B:
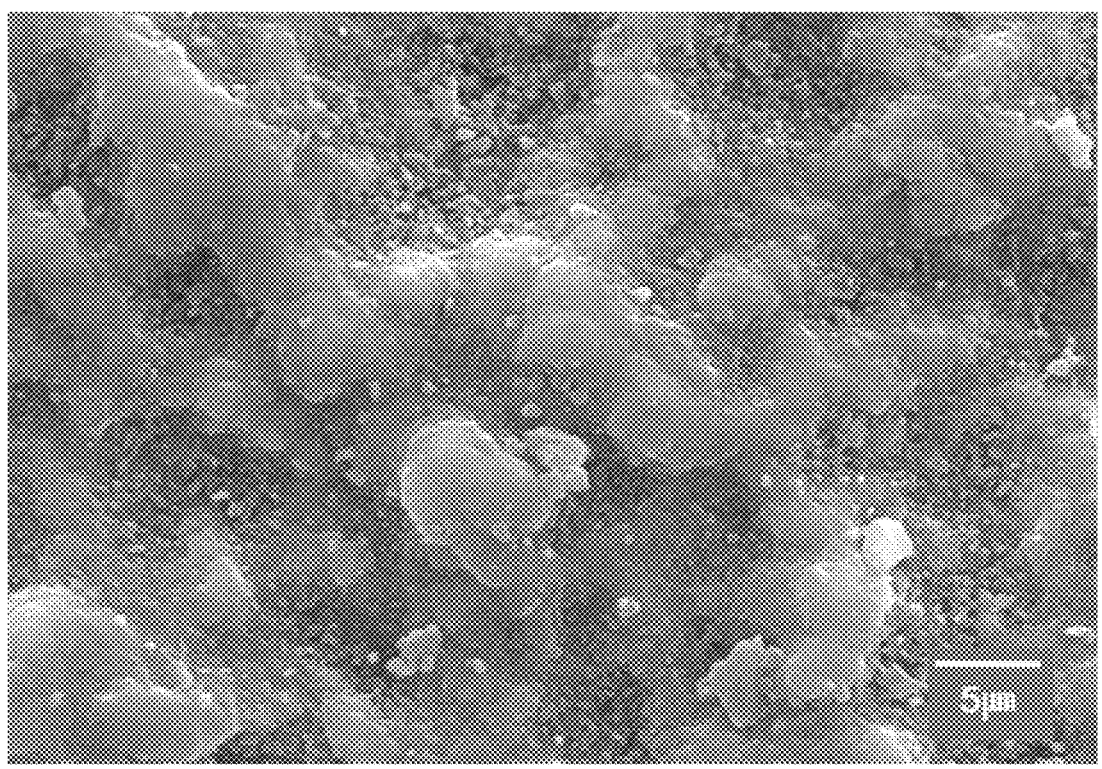

FIG. 9A is an SEM photograph illustrating a prior art ceramic coating layer and FIG. 9B is an SEM photograph illustrating a ceramic coating layer according to an embodiment of the present invention.

In more detail, FIG. 9A is an SEM photograph of a plasma resistant ceramic coating layer formed on a surface of a base material by atmosphere plasma spray (APS). In the APS, a plasma is generated by creating a gas condition inert to high energy of a DC discharge generated by applying a high voltage in the air. The plasma has heat energy having an ultrahigh temperature in the range of approximately 10,000° C. to approximately 20,000° C. In addition, the ceramic powder having a grain size scale in the range of approximately 30 µm to approximately 50 µm is exposed to the plasma having a ultrahigh temperature to be melted in the base material and to be sprayed to form the ceramic coating layer having a grain size scale in the range of approximately 5 µm to approximately 10 µm. However, the ceramic coating layer formed by APS may have a high porosity (e.g., 2 to 5%), as shown in FIG. 9A, due to an extremely rapid phase transition of the ceramic powder exposed to an ultrahigh temperature region and a non-uniform melting time, and many micro cracks may be generated due to high temperature collision of the plasma resistant ceramic coating layer. As described above, the plasma resistant ceramic coating layer formed by APS may have a high specific surface area and many micro cracks. Therefore, when the plasma resistant ceramic coating layer is employed to a semiconductor/display manufacturing process, particles of the plasma resistant coating may be corroded, resulting in contamination of processing parts and ultimately causing damages to a product of the semiconductor/display manufacturing process.

Meanwhile, as illustrated in FIG. 9B, the plasma resistant ceramic coating layer according to the present invention demonstrate compactness and a small specific surface area. As described above, the plasma resistant ceramic coating layer according to the present invention has a porosity in the range of approximately 0.01% to approximately 1.0%, which is much smaller than the conventional porosity. In other words, the plasma resistant ceramic coating layer according to the present invention has a compactness range in the range of approximately 99% to approximately 99.99%, which is much higher than the conventional compactness ratio. Therefore, the plasma resistant ceramic coating layer according to the present invention has much higher plasma resistance than the prior art plasma resistant ceramic coating layer.

Table 1 shows comparison results of various physical properties of the plasma resistant ceramic coating layer according to the prior art by APS and the plasma resistant ceramic coating layer according to the present invention.

TABLE 1

|  | Prior Art (APS) | Present Invention |
|---|---|---|
| Hardness | 1~2 GPa | 9~13 GPa |
| Adhesion strength | 5~6 MPa | 70~90 MPa |
| Porosity | 2~4% | 0.01~1.0% |
| Withstand voltage | 10~20 V/μm | 80~120 V/μm |

As listed in Table 1, whereas the prior art plasma resistant ceramic coating layer had a hardness of 1 to 2 GPa, the plasma resistant ceramic coating layer according to the present invention had a hardness of 9 to 13 GPa. In addition, whereas the prior art plasma resistant ceramic coating layer had an adhesion strength of 5 to 6 MPa, the plasma resistant ceramic coating layer according to the present invention had an adhesion strength of 70 to 90 MPa. In addition, whereas the prior art plasma resistant ceramic coating layer had a porosity of 2 to 4%, the plasma resistant ceramic coating layer according to the present invention had a porosity of 0.01 to 1.0%. Finally, whereas the prior art plasma resistant ceramic coating layer had a withstand voltage of 10 to 20 V/μm, the plasma resistant ceramic coating layer according to the present invention had a withstand voltage of 80 to 120 V/μm.

As described above, compared to the prior art, the present invention provides the plasma resistant ceramic coating layer having increased plasma resistance is superior in view of hardness, adhesion strength, porosity and withstand voltage. Accordingly, the plasma resistant ceramic coating layer has improved plasma resistance under a plasma environment.

Here, the hardness is measured by a mark created by pressing the plasma resistant ceramic coating layer using a diamond quadrangular pyramid tool, the adhesion strength is measured by pulling the plasma resistant coating formed on a base material using a rod cell, the withstand voltage is measured by installing two electrodes on the plasma resistant ceramic coating layer, and the porosity is measured by obtaining an image obtained by cutting the plasma resistant ceramic coating layer, photographing the cut plasma resistant ceramic coating layer and analyzing the image using a computer having image processing software. Since the measuring methods are widely well known to one skilled in the art, detailed descriptions thereof will not be given.

Meanwhile, the base material on which the plasma resistant ceramic coating layer according to the present invention is formed may be a part exposed to the plasma environment. That is to say, the part may be an internal part of the processing chamber for manufacturing semiconductors or displays. In more detail, the part may include one selected from the group consisting of an electro static chuck, a heater, a chamber liner, a shower head, a boat for chemical vapor deposition (CVD), a focus ring, a wall liner, a shield, a cold pad, a source head, an outer liner, a deposition shield, an upper liner, an exhaust plate, an edge ring, a mask frame and equivalents thereof. However, the present invention does not limit the base material or part on which the plasma resistant ceramic coating layer is formed to those listed herein.

As described above, according to the present invention, the first ceramic particles having a first grain size scale and a first modal value and the second ceramic particles having a second grain size scale larger than the first grain size scale and a second modal value larger than the first modal value coexist in a mixed state to form a ceramic coating layer, thereby achieving a base material having increased light transmittance (or translucency) while having a high laminating speed in forming the ceramic coating layer.

Moreover, since the first ceramic particles having a first grain size scale and a first modal value and the second ceramic particles having a second grain size scale and a second modal value are appropriately mixed to form the coating layer, a stable coating structure having a porosity of less than 1.0% (i.e., a highly compact coating structure) can be achieved while suppressing surface micro cracks.

In addition, according to the present invention, the stress of the coating layer formed on a surface of the base material can be easily adjusted to a desired value by adjusting the powder grain size scale and pressure differences.

Additionally, the present invention provides a ceramic coating layer having increased plasma resistance, which is superior to the prior art ceramic coating layer in view of hardness, adhesion strength and withstand voltage characteristics.

While the forming method of a ceramic coating layer having increased plasma resistance and the ceramic coating layer thereof according to the present invention have been particularly shown and described with reference to exemplary embodiments thereof, it will be understood by those of ordinary skill in the art that various changes in form and details may be made therein without departing from the spirit and scope of the present invention as defined by the following claims.

INDUSTRIAL APPLICABILITY

The present can be applied to a plasma resistant coating layer, a bio ceramic coating layer and/or an insulating coating layer.

The invention claimed is:

1. A ceramic coating layer having improved plasma resistance, the ceramic coating layer comprising:
   multiple first ceramic particles having a first grain size; and
   multiple second ceramic particles having a second grain size larger than the first grain size,
   wherein the multiple first and second ceramic particles are mixed to then be coated on a base material to form a ceramic coating layer, the first grain size of the first ceramic particles ranges from 200 nm to 900 nm, the second grain size of the second ceramic particles ranges from 900 nm to 10 μm, the first and second ceramic particles are the same material, the base material is a component exposed to a plasma environment, and the first and second ceramic particles include yttrium-based oxide,
   wherein the maximum number of the first ceramic particles exists between 250 nm and 350 nm in the first grain size scale and the maximum number of the second ceramic particles exists between 1.0 μm and 1.2 μm in the second grain size scale.

2. The ceramic coating layer of claim 1, wherein the maximum number of the first ceramic particles is greater than the maximum number of the second ceramic particles.

3. The ceramic coating layer of claim 1, wherein the porosity of the ceramic coating layer is in the range of 0.01% to 1.0%.

4. The ceramic coating layer of claim 1, wherein the cross-sectional ratio of the first ceramic particles to the second ceramic particles is in the range of 9:1 to 5:5.

5. The ceramic coating layer of claim 1, wherein the component is an internal component of a processing chamber for manufacturing a semiconductor or a display.

6. The ceramic coating layer of claim 5, wherein the component includes one selected from the group consisting of an electro static chuck, a heater, a chamber liner, a shower head, a boat for chemical vapor deposition (CVD), a focus ring, a wall liner, a shield, a cold pad, a source head, an outer liner, a deposition shield, an upper liner, an exhaust plate, an edge ring, and a mask frame.

\* \* \* \* \*